United States Patent
Abdo et al.

(10) Patent No.: US 9,444,430 B1
(45) Date of Patent: Sep. 13, 2016

(54) CAVITY FILTERED QUBIT

(71) Applicant: International Business Machines Corporation, Armonk, NY (US)

(72) Inventors: Baleegh Abdo, Carmel, NY (US); Jerry M. Chow, White Plains, NY (US); Jay M. Gambetta, Yorktown Heights, NY (US); Hanhee Paik, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/873,745

(22) Filed: Oct. 2, 2015

(51) Int. Cl.
| H03K 5/00 | (2006.01) |
| H03H 11/04 | (2006.01) |
| H01F 38/14 | (2006.01) |
| H01L 39/22 | (2006.01) |
| H03K 19/195 | (2006.01) |

(52) U.S. Cl.
CPC .......... *H03H 11/0405* (2013.01); *H01F 38/14* (2013.01); *H01L 39/223* (2013.01); *H01F 2038/146* (2013.01); *H03H 2011/0488* (2013.01); *H03K 19/1958* (2013.01)

(58) Field of Classification Search
CPC .. H03K 19/1958; H03K 17/92; B82Y 10/00; H01L 31/223
USPC ......... 505/190–192, 210, 433; 327/551–559, 327/527, 528; 326/1–5; 29/299
See application file for complete search history.

(56) References Cited

U.S. PATENT DOCUMENTS

| 4,489,292 | A | 12/1984 | Ogawa |
| 6,900,454 | B2 * | 5/2005 | Blais ............... B82Y 10/00 257/14 |
| 6,930,320 | B2 * | 8/2005 | Blais ............... B82Y 10/00 257/14 |
| 8,102,185 | B2 * | 1/2012 | Johansson ........ B82Y 10/00 326/3 |
| 8,138,784 | B2 * | 3/2012 | Przybysz ......... G06N 99/002 326/4 |
| 8,441,329 | B2 | 5/2013 | Thom et al. |
| 8,745,850 | B2 | 6/2014 | Farinelli et al. |
| 8,841,329 | B2 | 9/2014 | Shi et al. |
| 8,928,391 | B2 | 1/2015 | Naaman et al. |
| 9,041,427 | B2 | 5/2015 | Gambetta et al. |

OTHER PUBLICATIONS

E. Jeffrey, et al.,"Fast Accurate State Measurement with Superconducting Qubits," Physical Review Letters, vol. 112, No. 190504, May 15, 2014, pp. 1-5.
List of IBM Patents or Patent Applications Treated as Related; Dated Filed: Oct. 2, 2015, p. 1-2.
M.D. Reed, et al.,"Fast reset and suppressing spontaneous emission of a superconducting qubit," Applied Physics Letter, vol. 96, No. 203110, May 2010, pp. 1-3.
N. T. Bronn, et al.,"Reducing Spontaneous Emission in Circuit Quantum Electrodynamics by a Combined Readout/Filter Technique," arXiv Preprint arXiv:1504.04353, Apr. 16, 2015, pp. 1-8.

(Continued)

*Primary Examiner* — Dinh T Le
(74) *Attorney, Agent, or Firm* — Cantor Colburn LLP; Vazken Alexanian (57) ABSTRACT

A technique relates to a microwave device. A qubit is connected to a first end of a first coupling capacitor and a first end of a second coupling capacitor. A resonator is connected to a second end of the first coupling capacitor and a second end of the second coupling capacitor. The resonator includes a fundamental resonance mode. A filter is connected to both the qubit and the first end of the first or second coupling capacitor.

12 Claims, 6 Drawing Sheets

(56) References Cited

OTHER PUBLICATIONS

N.T. Bronn, et al.,"Reducing Spontaneous Emission in Circuit Quantum Electrodynamics by a Combined Readout and Filter Technique," U.S. Appl. No. 14/512,489, filed Oct. 13, 2014.
W-H. Tu, et al.,"Compact Microstrip Bandstop Filter Using Open Stub and Spurline," IEEE Microwave and Wireless Components Letters, vol. 15, No. 4, Apr. 11, 2005, pp. 1-3.
N.T. Bronn, et al., "Reducing Spontaneous Emission in Circuit Quantum Electrodynamics by a Combined Readout and Filter Technique," U.S. Appl. No. 14/512,489, filed Oct. 13, 2014.
W.H. Tu, et al., "Compact Microstrip Bandstop Filter Using Open Stub and Spurline," IEEE Microwave and Wireless Components Letters, vol. 15, No. 4, Apr. 11, 2005, pp. 1-3.
Baleegh Abdo, et al., "Cavity Filtered Qubit," U.S. Appl. No. 14/952,125, filed Nov. 25, 2015.

* cited by examiner

FIG. 2
RESONATOR-FILTERED QUBIT
(CAVITY-FILTERED QUBIT)

FIG. 1
PURCELL FILTER

RECEIVE, BY AT LEAST ONE OF A NODE A AND A NODE B, A MICROWAVE SIGNAL WITHIN A FREQUENCY BAND 705

→

PROTECT, BY A FILTER, A QUBIT FROM THE MICORWAVE SIGNAL WITHIN THE FREQUENCY BAND, THE QUBIT BEING CONNECTED TO THE NODE A AND THE NODE B, WHEREIN THE FILTER IS CONNECTED TO AT LEAST ONE OF THE NODE A AND THE NODE B, WHERE THE NODE A IS ON AN OPPOSITE SIDE OF A FIRST COUPLING CAPACITOR FROM A READOUT RESONATOR, AND WHEREIN THE NODE B IS ON AN OPPOSITE SIDE OF A SECOND COUPLING CAPACITOR FROM THE READOUT RESONATOR 710

US 9,444,430 B1

CAVITY FILTERED QUBIT

STATEMENT REGARDING FEDERALLY SPONSORED RESEARCH OR DEVELOPMENT

This invention was made with Government support under Contract No.: W911NF-10-1-0324 awarded by Army Research Office (ARO). The Government has certain rights in this invention.

BACKGROUND

The present invention relates to quantum information processing with superconducting circuits in the microwave domain, and more specifically, to a cavity-filtered qubit or readout resonator filtered qubit.

A photon is an elementary particle, the quantum of light and all other forms of electromagnetic radiation. A photon carries energy proportional to the radiation frequency but has zero rest mass.

In circuit quantum electrodynamics, quantum computing employs nonlinear superconducting devices called qubits to manipulate and store quantum information, and resonators (e.g., as a two-dimensional (2D) planar waveguide or as a three-dimensional (3D) microwave cavity) to read out and/or facilitate interaction among qubits. As one example, each superconducting qubit may comprise one or more Josephson junctions shunted by capacitors in parallel with the junctions. The qubits are capacitively coupled to 2D or 3D microwave cavities. The electromagnetic energy associated with the qubit is stored in the Josephson junctions and in the capacitive and inductive elements forming the qubit. To date, a major focus has been on improving lifetimes of the qubits in order to allow calculations (i.e., manipulation and readout) to take place before the information is lost due to decoherence of the qubits.

SUMMARY

According to one embodiment, a microwave device is provided. The microwave device includes a qubit connected to a first end of a first coupling capacitor and a first end of a second coupling capacitor, and a resonator connected to a second end of the first coupling capacitor and a second end of the second coupling capacitor. The resonator comprises a fundamental resonance mode and the fundamental resonance mode has a fundamental resonance mode frequency. Also, the microwave device includes a filter connected to both the qubit and the first end of the first coupling capacitor or to the qubit and the first end of the second coupling capacitor.

According to one embodiment, a method of configuring a microwave device is provided. The method includes connecting a qubit to a first end of a first coupling capacitor and a first end of a second coupling capacitor, connecting a resonator to a second end of the first coupling capacitor and a second end of the second coupling capacitor. The resonator comprises a fundamental resonance mode, and the fundamental resonance mode has a fundamental resonance mode frequency. Also, the method includes connecting a filter to both the qubit and the first end of the first coupling capacitor or to the qubit and the first end of the second coupling capacitor.

According to one embodiment, a microwave device is provided. The microwave device includes a qubit connected to a first end of a first coupling capacitor and a first end of a second coupling capacitor, and a resonator connected to a second end of the first coupling capacitor and a second end of the second coupling capacitor. The resonator comprises a fundamental resonance mode, and the fundamental resonance mode has a fundamental resonance mode frequency. Also, the microwave device includes a first one or more filters connected to both the qubit and the first end of the first coupling capacitor, and a second one or more filters connected to both the qubit and the first end of the second coupling capacitor.

According to one embodiment, a method of operating a microwave device is provided. The method includes receiving microwave signals within a frequency band at least one of at a node A and at a node B, and protecting, by a filter, a qubit from the microwave signals applied within the frequency band, where the qubit is connected to the node A and the node B. The filter is connected to at least one of the node A and the node B. The node A is on an opposite side of a first coupling capacitor than a resonator, and the node B is on an opposite side of a second coupling capacitor than the resonator.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

DETAILED DESCRIPTION

Circuit quantum electrodynamics includes a resonator (readout resonator or bus resonator) coupled to a qubit (qubit circuit). The resonator has a resonance frequency. In order to read out the state of the qubit, a readout signal is applied to the resonator at a readout frequency. The readout frequency coincides or lies close to the resonator resonance frequency. Applying strong microwave tones/signals to the resonator (at the gate or resonance frequency and/or near the gate or resonance frequency) can have negative effects on the qubit. For example, applying large classical signals to the resonator may generate a large amount of quasiparticles in the Josephson junctions of the qubit and/or in the vicinity of Josephson junctions; this leads to a decrease in the relaxation time of the qubit or causes the Josephson junctions of the qubit to switch to the voltage state, thereby causing the qubit to lose coherence completely. A voltage state is when the Josephson junction has a direct current (DC) resistance, such that a non-zero voltage develops across the Josephson junction.

Two common scenarios in which strong microwave tones/signals are applied to resonators are 1) high power readout via a readout resonator, and 2) an off-resonant microwave signal performing a qubit gate operation including the resonator induced phase (RIP) gate applied to a bus resonator. High power readout is a qubit readout technique in which a strong microwave signal is applied to the resonator at the readout frequency and whose power exceeds the critical photon number (e.g., 100 photons) per inverse bandwidth of the resonator at which the resonator starts to display nonlinear effects. The bus resonator is usually used in order to couple several qubits together. The resonator induced phase (RIP) gate is a qubit-gate operation performed via entangling multiple qubits coupled to a bus resonator by applying a strong off-resonant microwave signal to the bus. The number of photons in the strong off-resonant microwave signal can be as high as 1000 photons which translates into fewer photons circulating in the resonator depending on the resonator bandwidth and the detuning between the frequency of the applied signal and the resonance frequency of the bus.

Embodiments are configured to incorporate a narrow-bandstop lossless filter in the qubit circuit, and the narrow-bandstop lossless filter filters out and/or rejects microwave signals applied in the vicinity of a certain frequency that can potentially have undesired effects on the qubit. In one embodiment, the narrow-bandstop lossless filter may be implemented using an open-circuited quarter-wavelength transmission line at the readout or the bus resonator frequency (or the unwanted frequency) connected to one electrode of the qubit. The open-circuited quarter-wavelength transmission line is a stub terminated in an open circuit and whose length is equal to quarter the wavelength of the unwanted frequency. The addition of such a quarter-wavelength stub to the qubit serves as an impedance transformer and effectively forms a short circuit for the qubit in the vicinity of the unwanted frequency (such as the readout frequency or the bus frequency) and thus protects the qubit from large microwave signals applied within that frequency band (i.e., by reflecting these signals off the qubit).

In another embodiment, the narrow-bandstop lossless filter may be implemented using equivalent lumped-element circuits that protect the qubit from the unwanted frequencies (such as the readout frequency or the bus frequency) within that frequency band.

It is noted that the term cavity is utilized to refer to the resonator.

Figure 1:
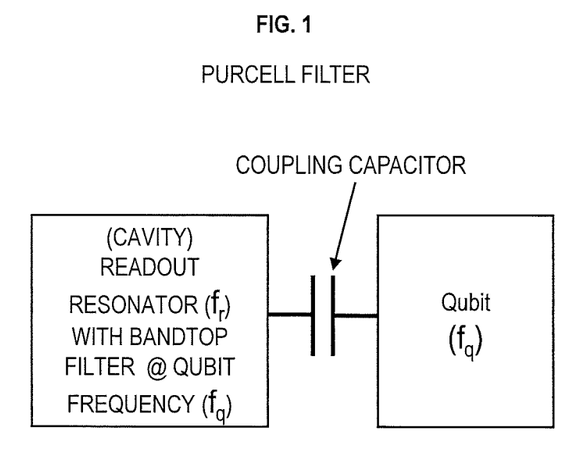
FIG. 1 is a high-level diagram of a quantum electrodynamics system with a Purcell filter.

FIG. 1 is a high-level diagram of a quantum electrodynamics system with a Purcell filter. The resonator (i.e., the cavity) is capacitively coupled to the qubit via a coupling capacitor. A Purcell filter that blocks microwave signals around the qubit frequency $f_q$ is integrated into the readout resonator or its feedline. Therefore, the Purcell filter inhibits the qubit from spontaneously emitting photons into the cavity. Both the resonator and the Purcell filter are on the opposite side of the coupling capacitor from the qubit, and thus the resonator and the Purcell filter are not part of the qubit circuit.

Figure 2:
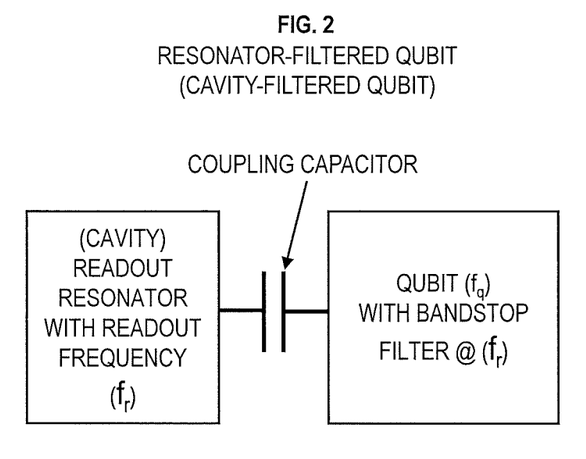
FIG. 2 is a high-level diagram of a quantum electrodynamics system with a cavity-filtered qubit or resonator-filtered qubit according to an embodiment.

FIG. 2 is a high-level diagram of a circuit quantum electrodynamics system with a cavity-filtered qubit or resonator-filtered qubit according to an embodiment. In FIG. 2, the resonator has a resonance frequency $f_r$ corresponding to the resonance mode of the resonator. The resonator is capacitively coupled to a qubit (which can be thought of as a nonlinear resonator) whose resonance frequency $f_q$ (i.e., the transition frequency between the ground and exited states) is detuned from the readout resonance frequency $f_r$. When a microwave signal is applied to the resonator at and/or near the resonance frequency $f_r$, most of the power of the signal circulates in the resonator circuit where the resonance response is maximal; however, some power percentage gets coupled to the qubit circuit via the capacitive coupling. The power percentage that couples from the resonator to the qubit depends on several circuit parameters, such as the frequency detuning between the two resonance circuits, the coupling capacitance between them, and the impedances of the resonator and qubit. Also, in the linear regime, the power percentage that couples to the qubit (from the readout resonator) is dependent on signal power, and thus the higher the applied power to the resonator is, the higher the power that gets transmitted to the qubit and negatively affects it. Accordingly, in FIG. 2 the qubit circuit includes a narrow-bandstop lossless filter that blocks microwave signals at and/or near the resonator frequency $f_r$ from entering the qubit. Thus, the narrow-bandstop lossless filter protects the qubit from strong microwave signals applied at and/or near the resonance frequency of the resonator.

In FIG. 2, the narrow-bandstop lossless filter is on the same side of the coupling capacitor as the qubit and is thus part of the qubit circuit itself. The resonator is on the opposite side of the coupling capacitor from the qubit and narrow-bandstop lossless filter, and the resonator is not part of the qubit circuit.

In one embodiment, multiple narrow-bandstop lossless filters may be on the same side of the coupling capacitor as the qubit. There may be some narrow-bandstop lossless filters that block microwave signals applied at the resonator frequency $f_r$ and other narrow-bandstop lossless filters that block microwave signals applied at predefined frequencies different from the resonator frequency $f_r$.

Figure 3:
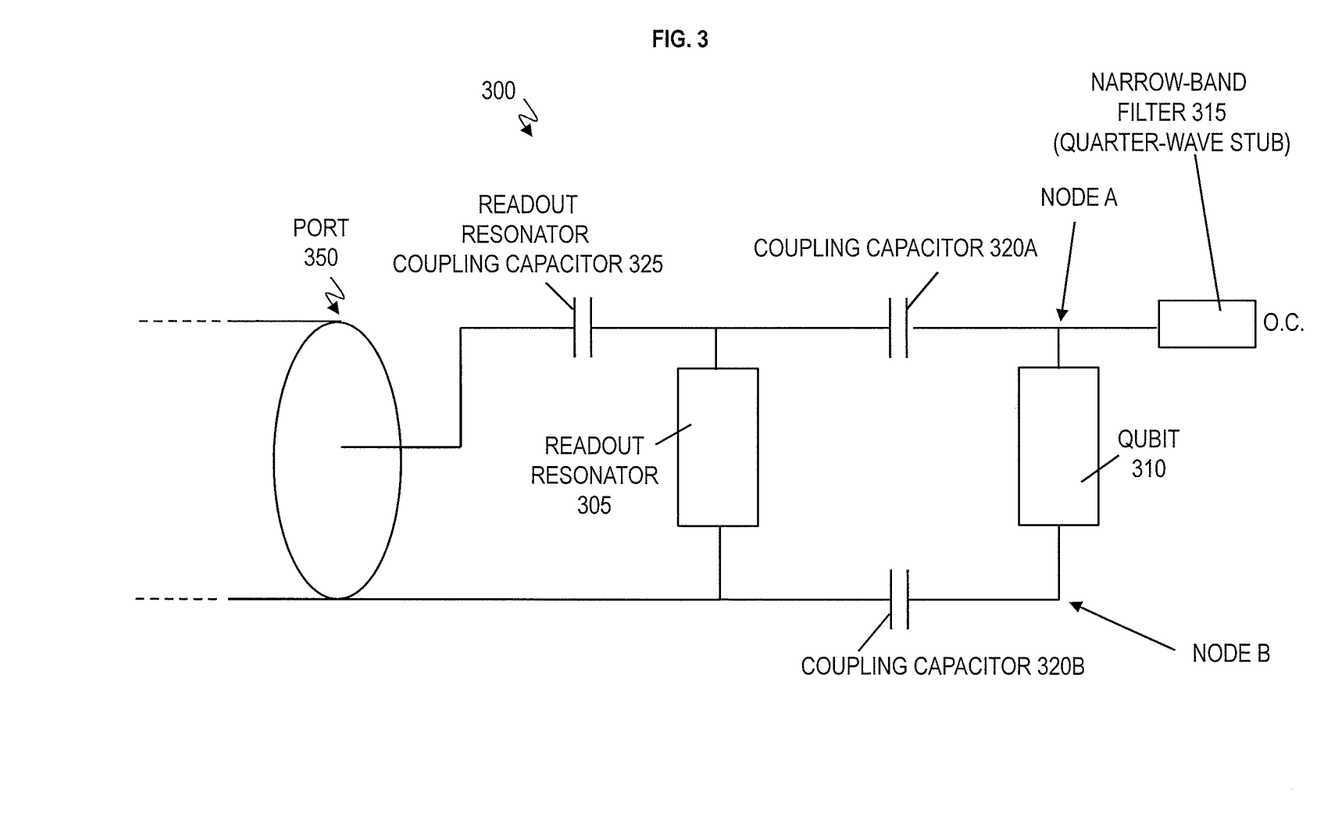
FIG. 3 is a schematic of a microwave device according to an embodiment.

FIG. 3 is a schematic of a microwave device 300 according to an embodiment. The microwave device 300 is an architecture for protecting a qubit 310 (i.e., qubit circuit) from microwave signals applied within a certain frequency band around the resonator resonance frequency $f_r$ of a resonator 305. In one implementation, the frequency band encompasses the resonator resonance frequency $f_r$ and a band of frequencies on the order of tens of megahertz above and below resonator resonance frequency $f_r$. Accordingly, a narrow-bandstop lossless filter 315 blocks and/or rejects unwanted frequencies in the frequency band.

The microwave device 300 includes the qubit 310 capacitively coupled to the resonator 305 by coupling capacitors 320A and 320B. The resonator 305 is capacitively coupled to a port 350 by resonator coupling capacitor 325. The port 350 is for the microwave device 300 to receive microwave signals and for measuring microwave signals reflected from the microwave device 300.

The resonator 305 may receive a microwave signal at resonance (i.e., at the resonator resonance frequency $f_r$) which excites the resonator 305, thereby causing the resonator 305 to resonate and also couple some percentage of the signal power to the qubit circuit 310. However, since the qubit 310 is connected to a narrow-bandstop lossless filter 315, the narrow-bandstop lossless filter 315 effectively blocks unwanted microwave signals which lie within a certain frequency band (e.g., at and near the resonance frequency $f_r$) from reaching the qubit 310, thereby protecting the qubit 310 against these unwanted signals.

Unlike the Purcell filter that protects the qubit from microwave signals at the qubit frequency $f_q$ (in particular, photon emission by the qubit itself to the resonator) where the Purcell filter is on the opposite side of the coupling capacitors than the qubit in FIG. 1, the narrow-bandstop lossless filter 315 is on the same side of the coupling capacitors 320A, 320B as the qubit 310 and protects the qubit 310 from the microwave signals at and/or near the resonator frequency $f_r$ applied to the resonator 305.

Unlike the Purcell filter, the narrow-bandstop lossless filter 315 is a part of the qubit circuit 310, and the narrow-bandstop lossless filter 315 may be configured to filter out and/or reject microwave signals applied in the vicinity of a predefined frequency (i.e., a frequency band containing the predefined frequency) that has negative effects on the qubit 310. In one case, the predefined frequency may be the frequency $f_r$. In another case, the predefined frequency may be a different frequency other than the frequency $f_r$.

In FIG. 3, the narrow-bandstop lossless filter 315 is a quarter-wavelength stub that has a length corresponding to a quarter wavelength of the predefined frequency. When the predefined frequency is the resonance frequency $f_r$ of the resonator 305, the narrow-bandstop lossless filter 315 is a quarter-wavelength stub that has a length corresponding to one quarter of the wavelength $\lambda_r$ of the resonator resonance frequency $f_r$. The quarter-wavelength stub has one end connected to both the coupling capacitor 320A and the qubit 310 at node A. The other end of the quarter-wavelength stub is terminated in an open circuit (O.C.). Accordingly, the narrow-bandstop lossless filter 315 is an open-circuited quarter-wavelength transmission line which serves as an impedance transformer and effectively forms a short circuit for the qubit 310 at and around the unwanted resonator frequency $f_r$, thus protecting the qubit 310 from large microwave signals applied within that frequency band.

Figure 4:
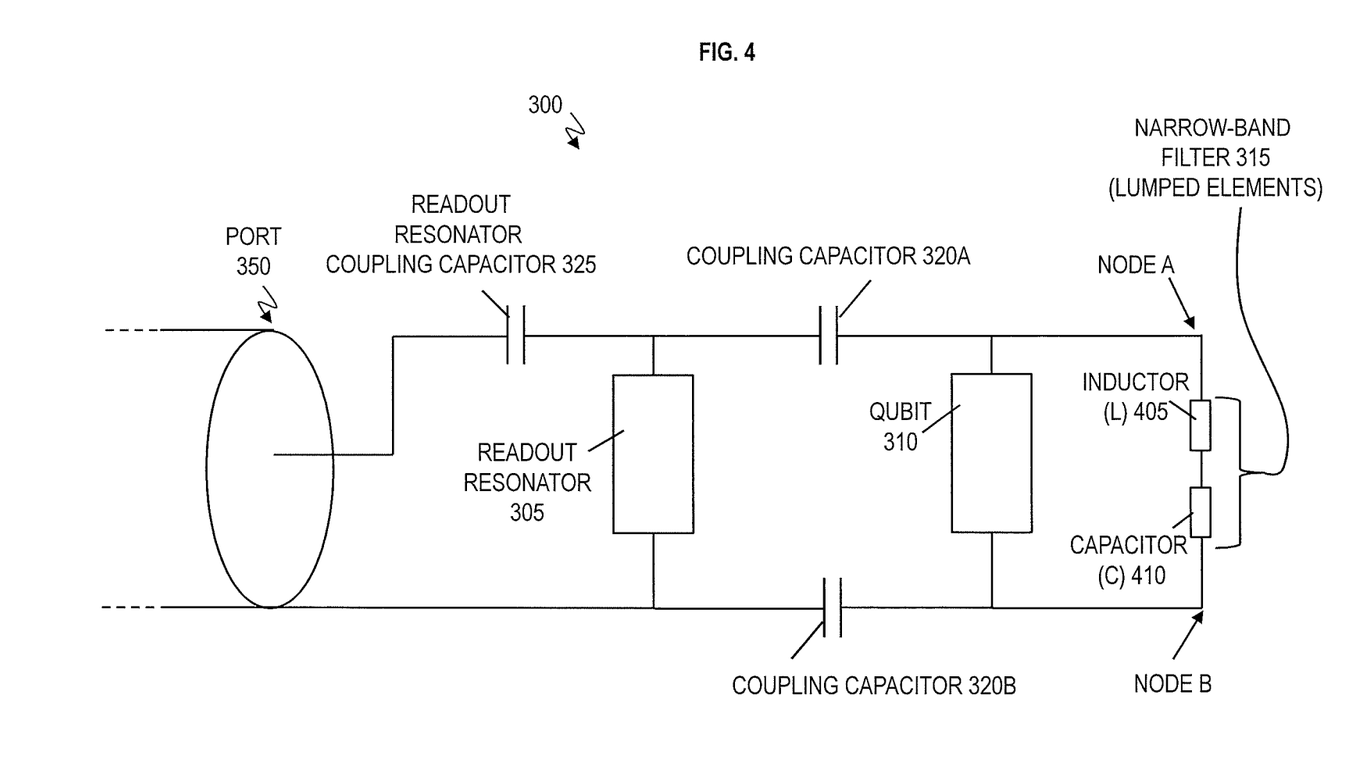
FIG. 4 is a schematic of the microwave device according to another embodiment.

FIG. 4 is a schematic of the microwave device 300 according to another embodiment. In FIG. 4, the narrow-bandstop lossless filter 315 is implemented using an equivalent lumped-element circuit of the transmission line stub which protects the qubit 310 from the unwanted frequencies (such as, e.g., the resonator frequency $f_r$) within the blocked frequency band.

Representing the narrow-bandstop lossless filter 315 may be one or more inductors (L) 405 connected in series with one or more capacitors (C) 410. In another implementation, the inductor 405 may be connected in parallel with the capacitor 410.

As discussed above, the microwave device 300 includes the qubit 310 capacitively coupled to the resonator 305 by coupling capacitors 320A and 320B. The resonator 305 is capacitively coupled to the port 350 by the coupling capacitor 325. Input and output microwave signals enter and leave the device 300 through the port 305.

In FIG. 4, the narrow-bandstop lossless filter 315 is connected in parallel to the qubit 310. For example, the top end of the narrow-bandstop lossless filter 315 (e.g., the inductor 405) is connected to both (e.g., the top electrode of) the qubit 310 and the coupling capacitor 320A at node A. Also, the bottom end of the narrow-bandstop lossless filter 315 (e.g., the capacitor 410) is connected to both (e.g., the bottom electrode of) the qubit 310 and the coupling capacitor 320B at node B. Again, the narrow-bandstop lossless filter 315 is connected to the qubit 310 on the opposite side of the coupling capacitors 320A, 320B than the resonator 305.

In FIG. 4, it is noted that when using the lumped element version of the narrow-bandstop lossless filter 315 the lumped element version may be implemented as an array of large Josephson junctions (with large critical current) and gap capacitors, plate capacitors, and/or interdigitated capacitors.

Figure 5:
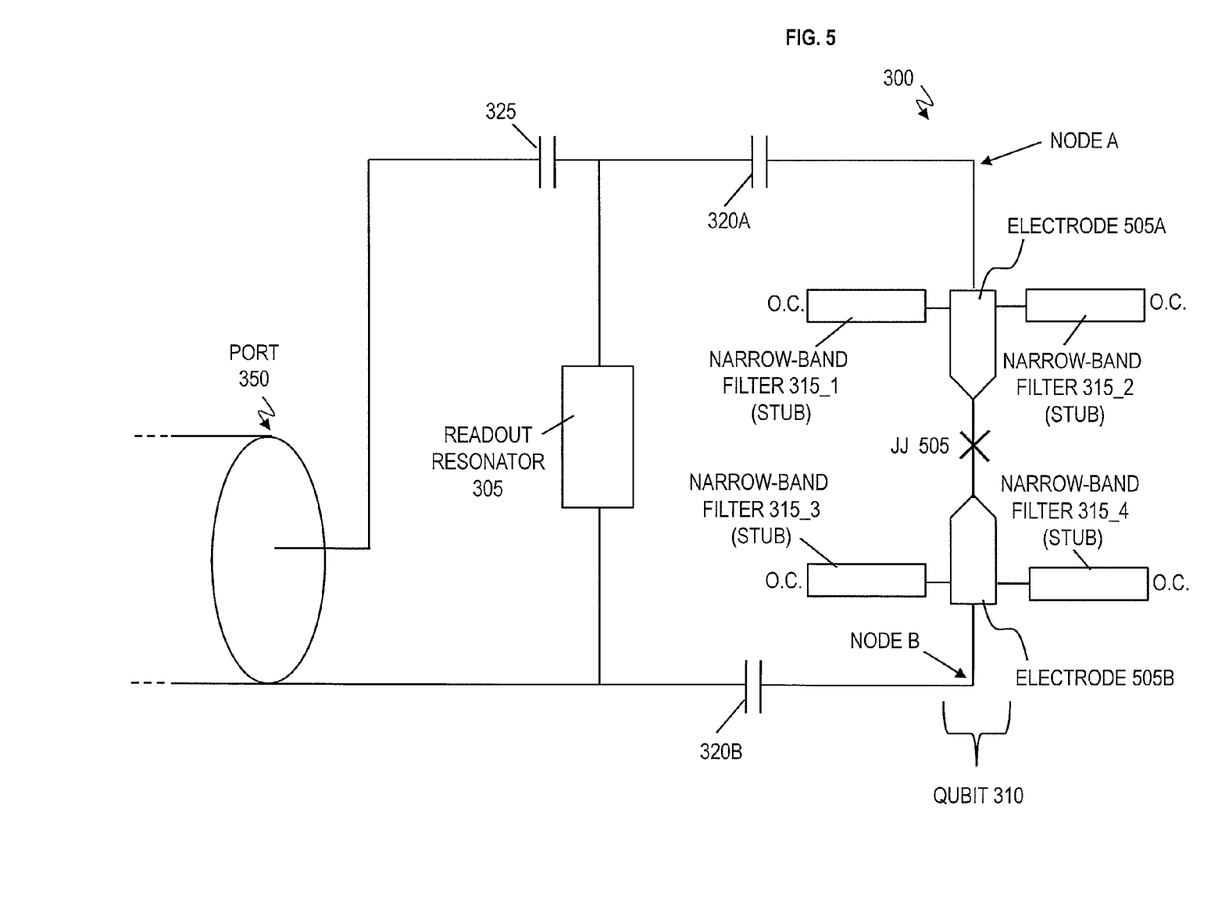
FIG. 5 is a schematic of the microwave device according to yet another embodiment.

FIG. 5 is a schematic of the microwave device 300 according to yet another embodiment. This configuration shows four narrow-bandstop lossless filters 315 used to protect the qubit 310. Previously discussed elements may not be repeated.

For explanation purposes, FIG. 5 illustrates four narrow-bandstop lossless filters 315. It is contemplated that the number of added narrow-bandstop lossless 315 in the microwave device 300 maybe one, two, three, four, five and so forth. After adding numerous narrow-bandstop lossless filters 315, there may be an area limitation (with respect to the physical size of the device 300) and a suitable technique may be utilized to reduce any parasitic capacitances between the different narrow-bandstop lossless filters 315.

In FIG. 5, the qubit 310 includes one or more Josephson junctions 505 connected to a top electrode 505A and a bottom electrode 505B. Narrow-bandstop lossless filters 315_1 and 315_2 may be quarter-wavelength stubs. At node A, one end of the narrow-bandstop lossless filters 315_1 and 315_2 is connected to the electrode 505A and is connected to the coupling capacitor 320A. The other end of the narrow-bandstop lossless filters 315_1 and 315_2 is terminated in an open circuit (O.C.).

Narrow-bandstop lossless filters 315_3 and 315_4 may be quarter-wavelength stubs. At node B, one end of the narrow-bandstop lossless filters 315_3 and 315_4 is connected to the electrode 505B and is connected to the coupling capacitor 320B. The other end of the narrow-bandstop lossless filters 315_3 and 315_4 is terminated in an open circuit (O.C.).

This configuration of the microwave device 300 utilizes four identical quarter-wavelength stubs (narrow-bandstop lossless filters 315_1, 315_2, 315_3, 315_4) to maintain the symmetry of the qubit circuit, while protecting it from unwanted frequencies. When four identical quarter-wavelength stubs are utilized, they each block the same frequency band. However, one quarter-wave stub is sufficient (as illustrated in FIG. 2). In one implementation, the four quarter-wave stubs (narrow-bandstop lossless filters 315_1, 315_2, 315_3, 315_4) may be designed such that they provide protection against four different frequencies. This means that the length of each quarter-wave stub would be different to block unwanted frequencies in four different frequency bands, where each quarter-wavelength stub blocks a single frequency band.

Two examples with numerical values are provided below for explanation purposes. The examples provide the length of the narrow-bandstop lossless filters 315 to block and protect the qubit 310 from, e.g., a frequency band centered around and/or including the unwanted frequency 7 GHz and a frequency band centered around and/or including the unwanted frequency 10 GHz. The examples are for a transmission line version of the narrow-bandstop lossless filters 315, e.g., a quarter-wavelength stub.

The wavelength of the unwanted frequency $f_r$ corresponds to the formula $$\lambda_r = \frac{c}{\sqrt{\varepsilon_{\it eff}}} \frac{1}{f_r},$$

where c is the light velocity in vacuum, $\varepsilon_{\it eff}$ is the effective dielectric constant seen by the filter. In one case, the wavelength of the unwanted frequency may be the resonator wavelength $\lambda_r$ (which may be the wavelength of the readout frequency in one implementation). In another case, the wavelength of the unwanted frequency can correspond to any predefined frequency that is desired. For $\in_{eff}=7$ (e.g., the effective dielectric constant for vacuum and sapphire), the length l of a quarter-wavelength stub for at least one narrow-bandstop lossless filter 315 is $$l = \frac{\lambda_r}{4} = 4 \text{ mm at 7 GHz.}$$

Also, for $\in_{eff}=7$ (e.g., the effective dielectric constant for vacuum and sapphire), the length l of a quarter-wavelength stub for at least one narrow-bandstop lossless filters 315 is $$l = \frac{\lambda_r}{4} = 2.8 \text{ mm at 10 GHz.}$$

As noted above, many options may be utilized to implement the four narrow-bandstop lossless filters 315 in FIG. 5. One of the four narrow-bandstop lossless filters 315, e.g., narrow-bandstop lossless filters 315_1, may block microwave signals at frequency $f_r$, and the other 3 narrow-bandstop lossless filters 315_2, 315_3, and 315_4 may be designed to block signals at other frequencies. In one case, two of the narrow-bandstop lossless filters 315 may block signals at the same frequencies while the other two narrow-bandstop lossless filters 315 block signals at different frequencies. As discussed herein, it is understood that the narrow-bandstop lossless filters 315 may be designed to block microwave signals at any unwanted frequencies from affecting the qubit 310 as desired. It is noted that the narrow-bandstop lossless filters 315 may be configured to block several different frequency bands.

Further the narrow-bandstop lossless filters 315 are lossless or more accurately of very low loss because they are made of superconducting material and embedded in a very low loss dielectric environment (substrate and vacuum). It is understood that operation of the microwave device 300 occurs at temperatures commensurate for superconducting as understood by one skilled in the art. The microwave device 300 may be placed in a dilution fridge for operation.

Figure 6:
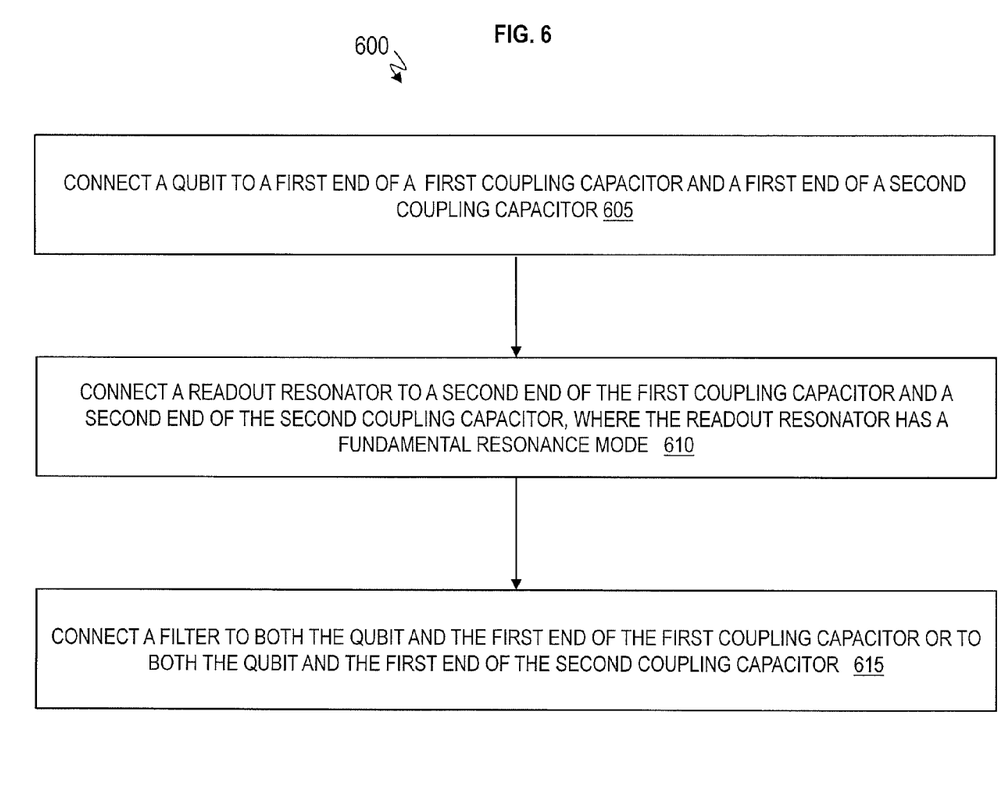
FIG. 6 is a flow chart of a method of configuring the microwave device to protect a qubit from microwave signals applied within an unwanted frequency band according to an embodiment.

Now turning to FIG. 6, a flow chart 600 is provided of a method of configuring the microwave device 300 to protect a qubit 310 from microwave signals applied within an unwanted frequency band. Reference can be made to FIGS. 2-5.

At block 605, a qubit 310 is connected to a first end of a first coupling capacitor 320A and a first end of a second coupling capacitor 320B.

At block 610, a resonator 305 is connected to a second end of the first coupling capacitor 320A and a second end of the second coupling capacitor 320B, where the resonator 305 has a fundamental resonance mode. The fundamental resonance mode has a fundamental resonance mode frequency.

At block 615, a narrow-bandstop lossless filter 315 is connected to both the qubit 310 and the first end of the first coupling capacitor 320A or the qubit 310 and the first end of the second coupling capacitor 320B. The first ends of the coupling capacitors 320A, 320B are on the same side as the qubit 310 and narrow-bandstop lossless filter 315. The second ends of the coupling capacitors 320A, 320B are on the same side as the resonator 305.

The narrow-bandstop lossless filter 315 is configured to block microwave signals applied at the fundamental resonance mode frequency $f_r$ of the fundamental resonance mode of the resonator, along with microwave signals applied at nearby frequencies, e.g., tens of megahertz above and below frequency $f_r$, thereby protecting the qubit 310 from microwave signals at the frequency $f_r$ of the fundamental resonance mode. The fundamental resonance mode of the resonator 305 has a wavelength $\lambda_r$.

The narrow-bandstop lossless filter 315 is a quarter-wavelength stub. A length of the quarter-wavelength stub corresponds to one quarter of the wavelength $\lambda_r$.

The narrow-bandstop lossless filter 315 comprises an inductor L 405 and a capacitor C 410 (e.g., lumped elements). The inductor is a lumped element. The inductor is a superconducting narrow line.

Figure 7:
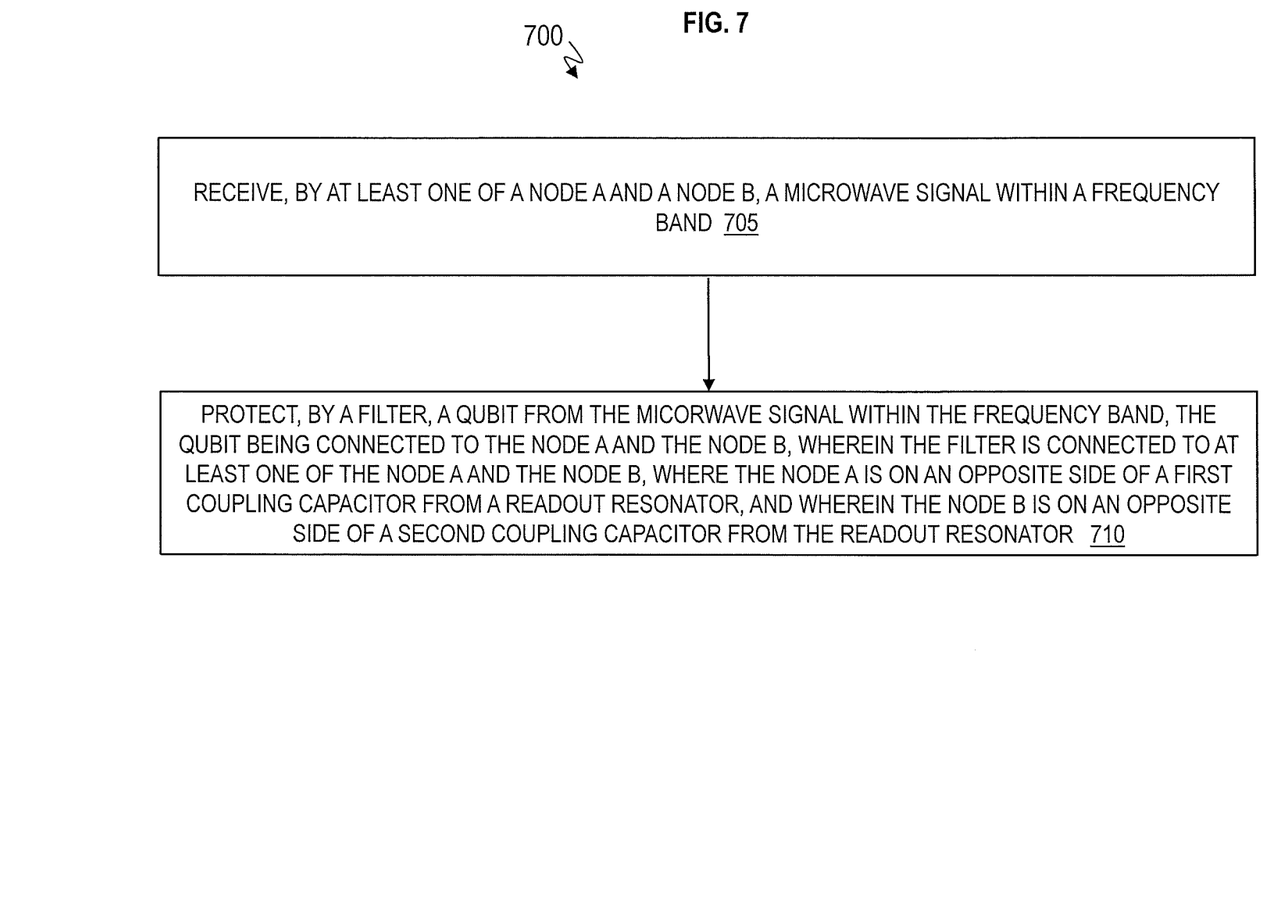
FIG. 7 is a flow chart of a method of operating the microwave device to protect the qubit from microwave signals applied within an unwanted frequencies according to an embodiment.

FIG. 7 is a flow chart 700 of a method of operating the microwave device 300 to protect the qubit 310 from microwave signals applied within a band of unwanted frequencies according to an embodiment. Reference can be made to FIGS. 2-6.

At block 705, at least one of a node A and/or a node B (of the microwave device 300) is configured to receive microwave signals applied at a frequency within a frequency band.

At block 710, narrow-bandstop lossless filter 315 protects the qubit 310 from microwave signals within a frequency band, and the qubit 310 is connected to the node A and the node B, where the filter 315 is connected to at least one of the node A and/or the node B, where the node A is on an opposite side of the first coupling capacitor 320A than the resonator 305, and where the node B is on an opposite side of a second coupling capacitor 320B than the resonator 305.

The frequency band corresponds to frequencies of microwave signals fed to the resonator 305. The resonator 305 has a frequency $f_r$. The frequency band comprises the frequency along with frequencies above and below the frequency $f_r$ by a predetermined amount. The predetermined amount may be 10 MHz, 100 MHz, 500 MHz, 1 GHz, etc.

The narrow-bandstop lossless filter 315 is configured to protect the qubit 310 from microwave signals at one or more frequencies in the frequency band, and the microwave signals at one or more frequencies cause the qubit to change state, relax, and/or lose coherence more rapidly in the absence of the filter 315.

It will be noted that various microelectronic device fabrication methods may be utilized to fabricate the components/elements discussed herein as understood by one skilled in the art. In superconducting and semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution.

After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A microwave device comprising:
    a qubit connected to a first end of a first coupling capacitor and a first end of a second coupling capacitor;
    a resonator connected to a second end of the first coupling capacitor and a second end of the second coupling capacitor, wherein the resonator has a fundamental resonance mode, the fundamental resonance mode having a fundamental resonance mode frequency; and
    a filter connected to both the qubit and the first end of the first coupling capacitor, the filter and the qubit both being connected together on a same side of the first coupling capacitor, such that both the filter and the qubit are on an opposite side of the first coupling capacitor than the resonator.

2. The microwave device of claim 1, wherein the filter is configured to block microwave signals at the fundamental resonance mode frequency of the resonator, thereby protecting the qubit from the microwave signals applied at the fundamental resonance mode frequency.

3. The microwave device of claim 2, wherein the fundamental resonance mode frequency of the resonator has a wavelength.

4. The microwave device of claim 3, wherein the filter is an open-circuited quarter-wavelength stub.

5. The microwave device of claim 4, wherein a length of the quarter-wavelength stub corresponds to a quarter of the wavelength.

6. The microwave device of claim 1, wherein the filter comprises an inductor and a capacitor.

7. The microwave device of claim 6, wherein the inductor is a lumped element or a superconducting line.

8. The microwave device of claim 6, wherein the capacitor is a gap capacitor, a plate capacitor, or an interdigitated capacitor.

9. A microwave device comprising:
    a qubit connected to a first end of a first coupling capacitor and a first end of a second coupling capacitor;
    a resonator connected to a second end of the first coupling capacitor and a second end of the second coupling capacitor, wherein the resonator comprises a fundamental resonance mode, the fundamental resonance mode having a fundamental resonance mode frequency;
    a first one or more filters connected to both the qubit and the first end of the first coupling capacitor, the first one or more filters and the qubit both being connected together on a same side of the first coupling capacitor, such that both the first one or more filters and the qubit are on an opposite side of the first coupling capacitor than the resonator; and
    a second one or more filters connected to both the qubit and the first end of the second coupling capacitor.

10. The microwave device of claim 9, wherein at least one filter of the first one or more filters is configured to block microwave signals applied at the fundamental resonance mode frequency of the resonator, thereby protecting the qubit from the microwave signals.

11. The microwave device of claim 10, wherein at least one filter of the second one or more filters is configured to block the microwave signals applied at the fundamental resonance mode frequency of the resonator, thereby protecting the qubit from the microwave signals.

12. The microwave device of claim 10, wherein at least one filter of the first one or more filters is configured to block microwave signals applied at other predefined frequencies, thereby protecting the qubit from the microwave signals at the other predefined frequencies which are different from the fundamental resonance mode frequency.

* * * * *